United States Patent [19]

Howell

[11] Patent Number: 5,237,622

[45] Date of Patent: Aug. 17, 1993

[54] SEMICONDUCTOR PICK-AND-PLACE MACHINE AUTOMATIC CALIBRATION APPARATUS

[75] Inventor: David A. Howell, Boise, Id.

[73] Assignee: Micron Technology, Inc., Boise, Id.

[21] Appl. No.: 802,310

[22] Filed: Dec. 4, 1991

[51] Int. Cl.⁵ .............................................. G06K 9/00
[52] U.S. Cl. ........................................ 382/8; 358/101; 382/48
[58] Field of Search ............... 382/8, 57, 48; 358/101, 358/106, 107

[56] References Cited

U.S. PATENT DOCUMENTS

| | | | |
|---|---|---|---|
| 4,953,100 | 8/1990 | Yotsuya | 382/8 |
| 4,973,852 | 11/1990 | Denkevitz | 382/8 |
| 4,989,082 | 1/1991 | Hopkins | 382/8 |
| 5,027,418 | 6/1991 | Ikegaya et al. | 382/8 |
| 5,134,575 | 7/1992 | Takagi | 382/8 |
| 5,140,643 | 8/1992 | Izumi et al. | 382/8 |

Primary Examiner—Joseph Mancuso
Attorney, Agent, or Firm—Hopkins, French, Crockett, Springer & Hoopes

[57] ABSTRACT

An apparatus and method of automatically performing a calibration of the accuracy of placement of semiconductor chips or devices by a pick-and-place machine. The parts are placed on an adhesive-backed glass plate that has calibrated black marks whose dimensions match those of a specific part lead footprint. A gray scale camera mounted on the machine above the inverted glass plate records and sends a signal to a machine computer identifying the coordinates of exposed part silver lead area. The computer calculates part placement error and sends error data to a CRT or camera screen and alarm to alert an operator.

14 Claims, 3 Drawing Sheets

# SEMICONDUCTOR PICK-AND-PLACE MACHINE AUTOMATIC CALIBRATION APPARATUS

FIELD OF THE INVENTION

The invention relates to a semiconductor pick-and-place automatic machine calibration method and apparatus having a black marked glass plate and an adhesive backing, such that part (micro chip or discrete electrical device) placement can be monitored by viewing the black marks relative to the device leads or pads from above or below with a camera as the glass plate passes through the IC chip pick-and-place machine.

BACKGROUND OF THE INVENTION

In a process of attaching multiple, tiny, discrete electrical devices or integrated circuit chips to a plastic circuit board (PCB), a pick-and-place machine can be used to pick up a part from a tray, rotate the part to a particular angular orientation, and then accurately place the part on a PCB. A typical machine placement accuracy should be about 0.006 inches (6 mils).

The consequence of inaccurate placement on the PCB is that a misalignment of the part lead over a solder bonding area can result in poor or lack of electrical contact between the part lead and the PCB conductor. The bonding is accomplished by inserting the loaded PCB in a furnace to melt the solder paste. A typical printed circuit assembly (PCA) can consist of numerous types of parts of components attached to a PCB.

If the pick-and-place machine has a consistent or periodic error, there can be catastrophic results in manufacturing these PCA's. A typical pick-and-place machine can have one or more, i.e. 12, rotating or linear motion heads with vacuum connections for picking. The rotation of the head places parts typically at 0°, 90°, 180°, and 270° on the PCB to match PCB connections. It is important that the placement be accurate in the X-plane, Y-plane, and angular orientation.

A glass board and glass part device is currently available from Fuji Electric Company that can be used to check pick-and-place machine accuracy in placement of a "glass" quad flat pack (QFP).

There are marks on the glass that differ in distance (i.e., 0.005") between marks compared to the leads of the QFP device. Thus, a misplaced device can be located by noting which of the marks line up with a corresponding lead.

This device has limited use in that it is not using the actual part but a glass part that simulates the QFP device. It, therefore, does not include the inherent dimensional differences within the device tolerances.

It is, therefore, the purpose of this invention to provide a unique, simple, automatic, accurate apparatus that, by a gray scale camera, determines proper micro chip or discrete device placement on a PCB. This invention utilizes a glass plate similar to that described in U.S. Pat. application Ser. No. 07/783,111, filed 10/25/91, by the same inventor and having a common assignee. The apparatus provides feedback to an operator on a periodic basis identifying improper part placement.

SUMMARY OF THE INVENTION

This invention discloses an apparatus that measures a micro chip or discrete device placement accuracy by monitoring part placement with a gray scale camera. In general terms, it uses a camera mounted above an inverted glass plate having black calibration marks on a top surface. An adhesive means, such as transparent double-backed adhesive tape, is placed over the top glass surface, and the glass plate is placed on a pick-and-place machine in-conveyor where it enters the machine. The pick-and-place machine, such as a Fuji FIP II, FCP III, then places devices or chips (based on a pre-programmed location) on the glass plate adhesive which retains the chips as it passes through the machine. The glass plate is then removed from the machine, inverted, and placed on the in-conveyor where it again enters the machine to be located under a camera scanning device.

The scanning device consists of a fiduciary gray scale camera that is mounted above a table of the pick-and-place machine. The camera can differentiate between a black pad pattern on the glass plate and the silver leads of a part above the pad. The silver leads of the component appear as white and the black patterns on the glass appear as black, providing the necessary contrast for the camera. When the white leads are visible below the black pad, there is a misorientation of that particular part. The camera records the offset by triangulation and sends a measurement of offset signal to a computer within the pick-and-place machine. The data is processed by the computer and an output to a CRT on the machine indicates both an error measurement and the related head(s) that has caused the error. Small errors would activate an alarm, and excessive errors would turn the pick-and-placement off, and repair or maintenance would then be performed as necessary.

Other objects, advantages, and capabilities of the present invention will become more apparent as the description proceeds.

DETAILED DESCRIPTION OF THE INVENTION

Figure 1:
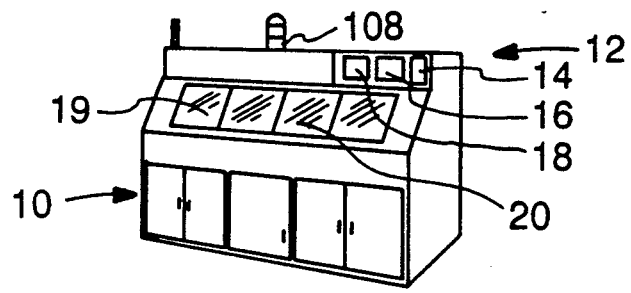
FIG. 1 is a front perspective view of a typical pick-and-place machine.

Referring to FIG. 1, a typical semiconductor pick-and-place machine is illustrated at 10. An upper section 12 of the machine contains numeric key pad 14, CRT screen 16, and camera screen 18, which displays a fiduciary camera picture as explained later. Sliding plexiglass windows 19 allow observation of the pick-and-place operations and access to the internal mechanisms.

Figure 2:
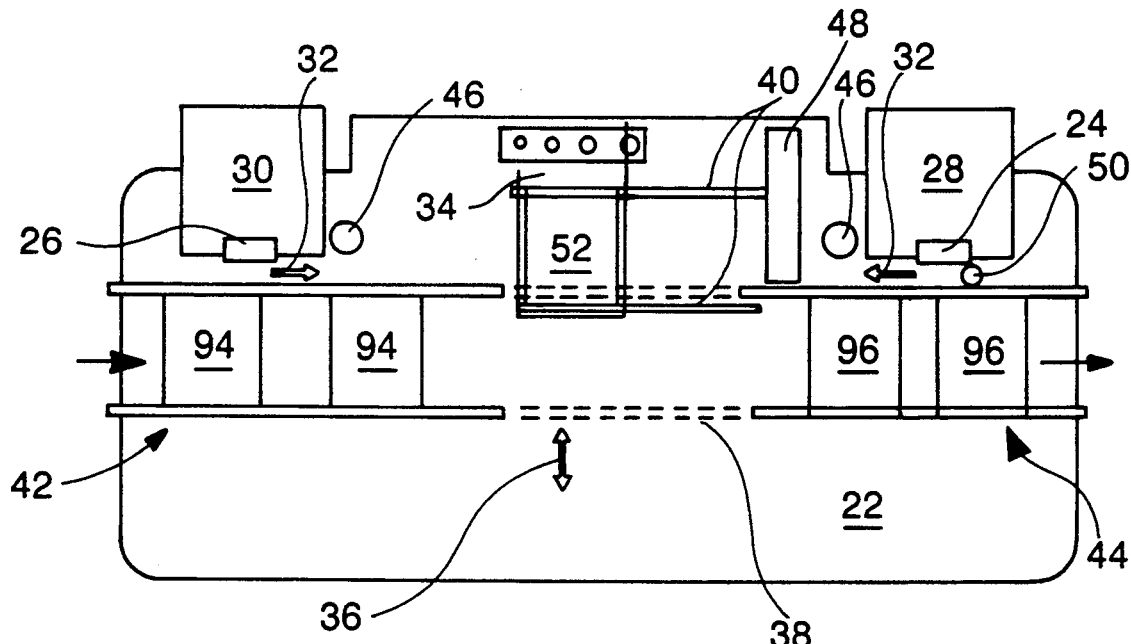
FIG. 2 is a plan view of the pick-and-place machine table.

The actual pick-and-place table, heads, and parts conveyors are within the machine housing as at 20. Referring to FIG. 2, the pick-and-place table 22 within machine 10 has a first placing head 24 and a second placing head 26, which are shown in a "pick" position over a first and second component feeder station 28 and 30. The heads are driven by servo motors on ball screw 54 (FIG. 3) in the "X" direction of arrows 32 to a "place" position over "Y" direction table 34. "Y" direction table can move back and forth as indicated by "Y" arrow 36 from the "place" position as shown to a "convey" position 38.

In the convey position 38, the rails 40 of the "Y" table conveyor line up with the rails of the PCB "in"-conveyor 42 and the PCB "out"-conveyor 44.

As the parts from the feeder station are transported toward the "Y" table, image sensor cameras 46 scan the components from below to confirm that it is the correct component. If not, it is loaded onto reject parts conveyor 48 and off loaded.

A fiduciary camera is shown at 50 mounted to the first head 24 to monitor the exact position of PCB 52 on the "Y" table 34 and then provide this data to a computer within the pick-and-place machine to properly control the placement of the component on the PCB 52. The fiduciary camera provides the exact coordinates of two silver fiduciary dots on two opposite edges of the PCB. These coordinates are read into the computer to exactly identify the X and Y plane and angular orientation of the PCB and, therefore, properly place the part.

Figure 3:
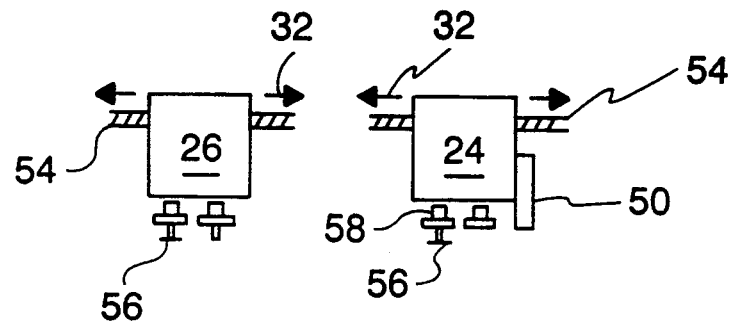
FIG. 3 is an elevation of a pickup head.

FIG. 3 illustrates the fiduciary camera 50 and the ball screws 54 that drives the placing heads 24 and 26 to the place position over "Y" table 34. In this figure, the component parts 56 are shown held in place by vacuum place nozzles 58. The heads 24 and 26 travel over to the PCB 52 (FIG. 2) and place the parts 56 in a position determined by the machine computer. Placement requires extreme accuracy in order to align the part leads with PCB pads prior to soldering.

Accurate placement is checked by placing the machine in a calibration test mode, as selected by a numeric key pad 14 input instruction. In this mode, which can be done perhaps on a weekly basis, the glass plate and adhesive replace the PCB's, and chips or devices are placed on the glass plate in a similar fashion as placement on PCB's. The glass plate is then run out on the out-conveyor, inverted to have the black marks up and parts below, and then the glass plate is placed on the in-conveyor 42 and transferred to the "Y" table 34. "Y" table motion as indicated at 36 and "X" direction motion as at 32 of the first head 28 position the glass plate and attached gray scale camera 50 scans all part positions looking for misalignment.

Returning now to FIG. 3, the invention consists of the use of the fiduciary gray-scale camera 50 mounted adjacent the first movable head 24. This camera monitors a special calibrated and marked glass as indicated at 62, 64, 66, and 68 on FIGS. 4–7. FIGS. 4 through 7 are drawings copied from photographs of four misaligned devices and enlarged about 10 times actual size.

Figure 4:
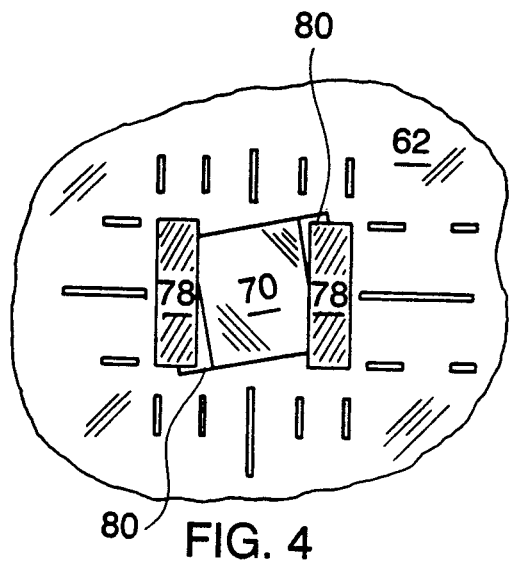
FIG. 4 is an enlarged plan view of a capacitor mounted askew on a calibration plate.
Figure 5:
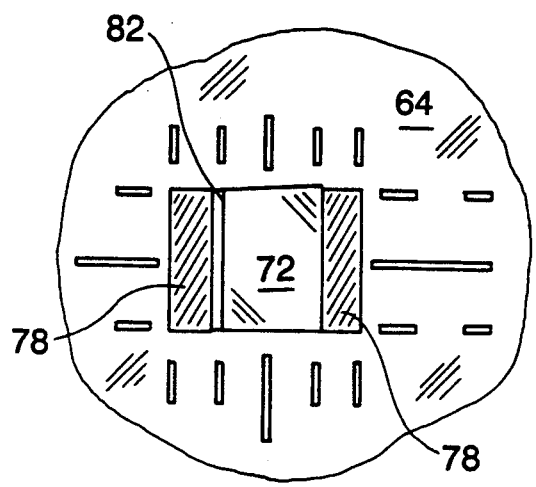
FIG. 5 is an enlarged plan view of a capacitor offset on the calibration plate.

FIGS. 4 and 5 show capacitors 70 and 72 attached to the top of the glass 62 which has been inverted and represents what is seen by the overhead fiduciary camera above the "Y" table.

Figure 6:
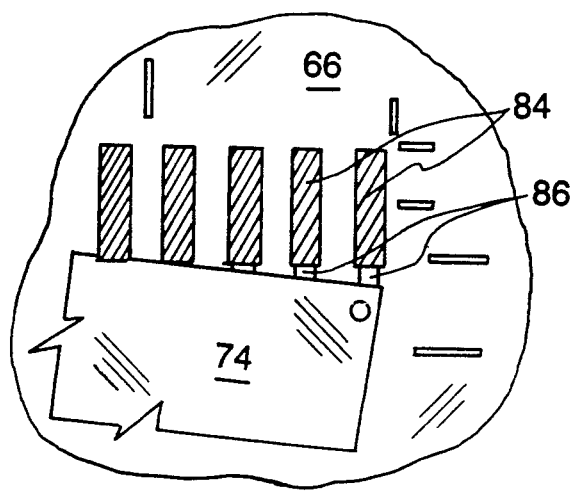
FIG. 6 is an enlarged plan view of an SOIC semiconductor mounted askew on a calibration plate.
Figure 7:
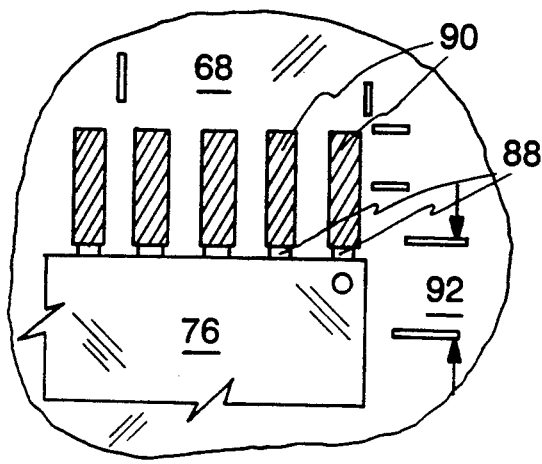
FIG. 7 is an enlarged plan view of an SOIC offset on the calibration plate.

In a similar fashion, SOIC devices 74 and 76 are illustrated mounted above glasses 66 and 68 of FIGS. 6 and 7.

In FIG. 4, it is noted that capacitor 70 is askew from pad black (shaded) marks 78. This shaded mark is in contrast to white (silver colored) leads exposed at triangular sections 80. The camera 50 (FIG. 2) detects this skewed device and transmits a signal to the computer relating the coordinates of the white area 80.

FIG. 5 illustrates a capacitor 72 affixed offset from black mark 78. In this case, the white lead is exposed on one side as rectangle 82 since the capacitor is misaligned to the right.

FIG. 6 illustrates a multi-lead SOIC chip 74, in this case again being placed askew relative to the calibrated black pad marks 84, revealing white leads at 86 of varying length.

FIG. 7 illustrates a misplaced SOIC 76 being offset in a downward such that white rectangles 88 appear below black pad marks 90. In all cases, the amount of error can be estimated by comparing white lead exposure 88 with the distance between the calibrated dimension marks at 92.

Operation of the machine will be made by referring to FIG. 2, 3, and 8. Referring first to FIG. 2, PCB's 94 are on the PCB in-conveyor 42 awaiting completion of part placement on PCB 52 that sets on "Y" table 34. Completed printed circuit assemblies 96 (PCA's) are shown on the outconveyor 44. The pick-and-place heads 24 and 26 work alternately and independently to place parts and 58 (FIG. 3) on the PCB 52. As each PCB 52 is completed, the "Y" table moves until its conveyor rail 40 is positioned at 38 to convey the PCA off the table to a visual inspection and then to a solder melt oven.

Figure 8:
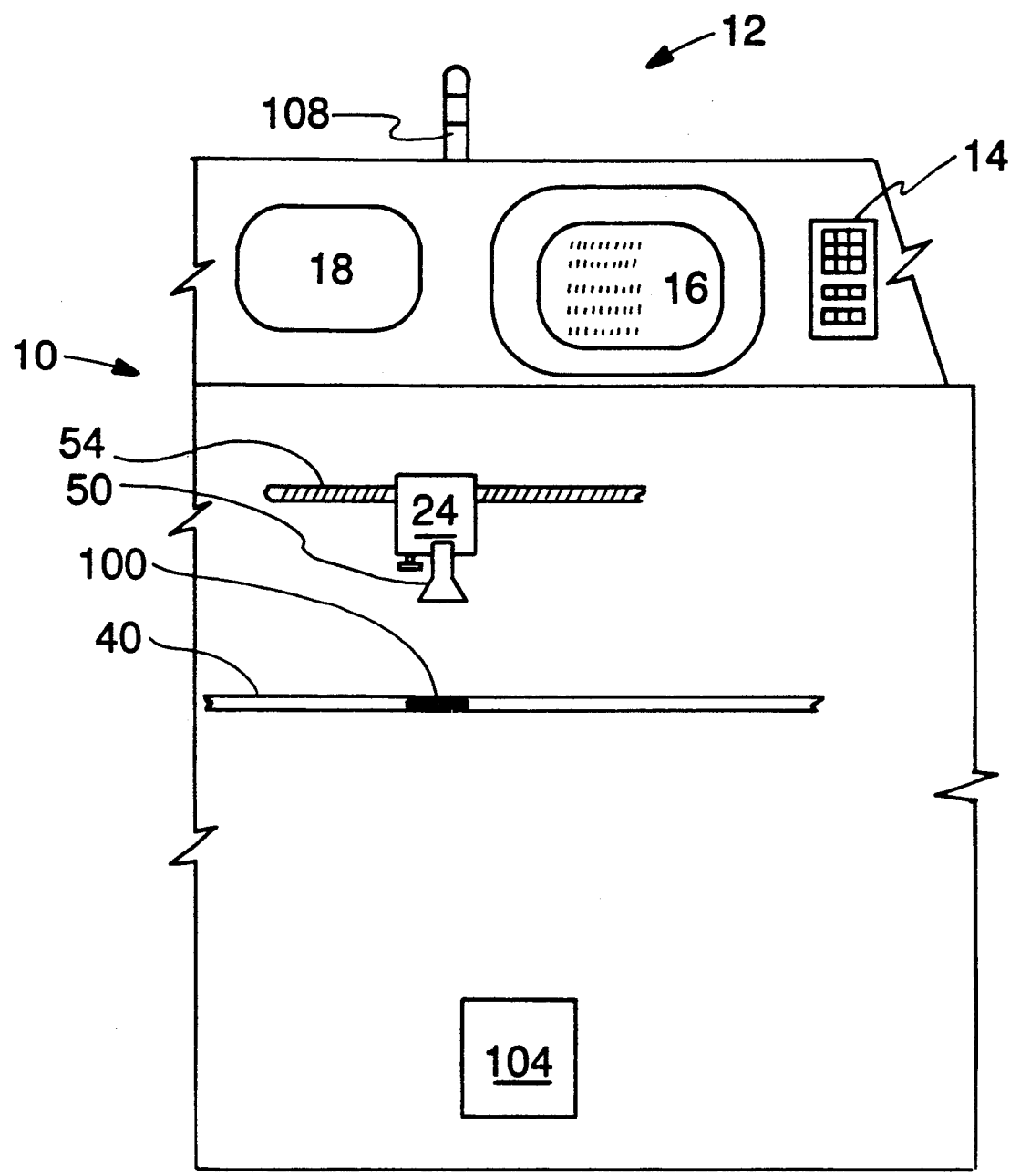
FIG. 8 is a schematic diagram and elevation view of the automatic calibration apparatus.

Referring to FIG. 8, in this case, a calibration mode has been selected at numeric key pad 14 and there is an inverted calibrated glass plate 100 over the fiduciary gray scale camera 50. The glass plate has the same dimensions as the PCB's being processed and similarly placed fiduciary dots. The camera 50 scans the inverted glass surface from above "Y" table 34 and records the presence of any white (leads) areas indicating misplaced part(s). A signal is sent to the machine computer 104 which analyzes the data and calculates a capability index for individual heads and an overall machine capability index. This index and head data would be displayed on CRT screen 16, or other readout, and alarms 108 or machine shutdown would occur at preset error values. For instance, a part offset of 0.005 inches might activate the alarm 108 and an offset of 0.006 inches would shutdown the machine until the problem is identified and corrected.

Although the description and drawings describe the chips as being SOIC's and the discrete devices as capacitors, there are many other parts that can be placed by the pick-and-place machines where this inspection apparatus can be used.

Some examples are: plastic leaded chip carriers (PLCC), very small outline package (VSOP), quad flat pack (QFP), and many discrete devices, such as resistors, coils, transistors, diodes, light-emitting diodes (LEDs), filters, and switches.

A method of monitoring and indicating the accuracy of part placement of a semiconductor pick-and-place machine generally comprises the steps of:

placing a calibrated glass plate having black marks and an adhesive on a glass plate top surface, on a machine PCB in-conveyor;

conveying the glass plate to a "Y" table;

placing a plurality of parts on the adhesive on the glass plate by a placing head;

conveying the glass plate and parts to a PCA outconveyor;

removing the glass plate from the out-conveyor and inverting the glass plate;

placing the glass plate on the PCB in-conveyor;

conveying the inverted glass plate to the "Y" table;

moving the place head and attached gray-scale camera over the inverted glass plate;

sensing a white area adjacent the glass plate black marks by a camera, indicating a part placement error;

transmitting a signal to a machine computer to indicate coordinates of the white area sensed; and indicating on a readout device the magnitude of a part placement error.

While preferred embodiments of the invention has been disclosed, various modes of carrying out the principles disclosed herein are contemplated as being within the scope of the following claims. Therefore, it is understood that the scope of the invention is not to be limited except as otherwise set forth in the claims.

I claim:

1. In a semiconductor chip manufacturing process, an apparatus that automatically monitors a pick-and-place machine part placement accuracy comprising:
   a. a movable downward scanning gray scale camera mounted above a movable "Y" table section of the machine;
   b. a glass plate having dimensions the same as a plurality of PC boards in an inverted position above the table;
   c. a plurality of black calibration marks on the glass plate that match a part lead footprint;
   d. an adhesive layer above the glass plate affixing a plurality of parts to a top of the plate;
   e. a signal output from the gray scale camera to a machine computer; and
   f. an output from the computer to a readout device wherein a misplaced part below the inverted glass plate exposes a silver chip lead and the camera senses a white area and sends a signal to the computer and readout device indicating part placement error.

2. The apparatus of claim 1 and wherein:
   the camera is mounted on a movable pick-and-place head.

3. The apparatus of claim 2 and wherein:
   the readout device is a CRT.

4. The apparatus of claim 2 and wherein:
   the readout device is a camera screen.

5. The apparatus of claim 2 and wherein:
   the computer output actuates a part placement error alarm at a first error magnitude.

6. The apparatus of claim 5 and wherein:
   the computer output shuts down the machine at a second higher error magnitude.

7. In a semiconductor chip manufacturing process, an apparatus that automatically monitors a pick-and-place machine part placement accuracy comprising:
   a. a movable downward scanning gray scale camera mounted to a pick-and-place head above "Y" table section of the machine;
   b. a glass plate having dimensions the same as a plurality of PC boards in an inverted position above the "Y" table section;
   c. a plurality of black calibration marks on the glass plate that match a part lead footprint;
   d. an adhesive layer above the glass plate affixing a plurality of parts to a top of the plate;
   e. a signal output from the gray scale camera to a machine computer; and
   f. an output from the computer to a CRT and a camera screen wherein a misplaced part below the inverted glass plate exposes a silver part lead and the camera senses a white area and sends a signal to the computer and to the CRT and the camera screen indicating a part placement error.

8. The apparatus of claim 7 and wherein:
   the computer output actuates a part placement error alarm at a first error magnitude.

9. The apparatus of claim 8 and wherein:
   the computer output shuts down the machine at a second higher error magnitude.

10. A method of monitoring and indicating the accuracy of part placement of a semiconductor pick-and-place machine comprising the steps of:
    a. placing a calibrated glass plate having black marks and an adhesive on a top surface of the glass plate, on a machine PCB in-conveyor;
    b. conveying the glass plate to a "Y" table;
    c. placing a plurality of parts on the adhesive on the glass plate by a place head;
    d. conveying the glass plate and parts to a PCA out-conveyor;
    e. removing the glass plate from the out-conveyor and inverting the glass plate;
    f. conveying the inverted glass plate to the "Y" table;
    g. moving the place head and an attached gray scale camera over the inverted glass plate;
    h. sensing a white area adjacent the glass plate black marks by the camera;
    i. transmitting a signal to a machine computer to indicate coordinates of the white area sensed; and
    j. indicating on a readout device a magnitude of a part placement error.

11. The method of claim 10 and wherein:
    an alarm is actuated by the computer at a first error magnitude.

12. The method of claim 11 and wherein:
    the machine is shutdown at a second higher error magnitude.

13. The method of claim 10 and wherein:
    the readout device is a CRT.

14. The method of claim 10 and wherein:
    the readout device is a camera screen.

* * * * *